United States Patent [19]
Hiramoto et al.

[11] Patent Number: 5,510,158
[45] Date of Patent: Apr. 23, 1996

[54] PROCESS FOR OXIDATION OF AN ARTICLE

[75] Inventors: Tatsumi Hiramoto, Tokyo; Tatsushi Igarashi; Hiromitsu Matsuno, both of Himeji; Takeo Matsushima; Shinichi Iso, both of Takasago, all of Japan

[73] Assignee: Ushiodenki Kabushiki Kaisha, Tokyo, Japan

[21] Appl. No.: 348,259

[22] Filed: Nov. 28, 1994

[30]     Foreign Application Priority Data

Nov. 26, 1993 [JP] Japan .................... 5-319238

[51] Int. Cl.$^6$ .............. C23C 16/48; B05D 3/00
[52] U.S. Cl. ............ 427/582; 427/553; 216/66
[58] Field of Search ............... 427/539, 553, 427/554, 555, 556, 558, 581, 582, 583, 584; 216/65, 66

[56]         References Cited

U.S. PATENT DOCUMENTS

| | | | |
|---|---|---|---|
| 3,890,176 | 6/1975 | Bolon | 134/39 |
| 4,265,747 | 5/1979 | Copa et al. | 219/121 |
| 4,806,456 | 2/1989 | Katoh | 430/296 |
| 4,837,484 | 6/1989 | Eliasson et al. | |
| 4,900,582 | 2/1990 | Nakayama et al. | 427/558 |
| 5,006,758 | 4/1991 | Gellert et al. | 313/634 |
| 5,028,560 | 7/1991 | Tsukamoto et al. | 437/81 |
| 5,068,040 | 11/1991 | Jackson | 210/748 |
| 5,156,884 | 10/1992 | Tanitsu | 427/558 |
| 5,178,772 | 1/1993 | Daley et al. | 210/721 |
| 5,215,592 | 6/1993 | Jackson | 134/1 |
| 5,236,602 | 8/1993 | Jackson | 210/748 |

Primary Examiner—Marianne Padgett
Attorney, Agent, or Firm—Sixbey, Friedman, Leedom & Ferguson; David S. Safran

[57]           ABSTRACT

An oxidation process for an article to be treated in which, by generating ozone with a high concentration, a high treatment rate is achieved. In particular, an oxygen-containing fluid is irradiated with a vacuum ultraviolet rays emitted from a dielectric barrier discharge lamp in which xenon gas is encapsulated, producing a photochemical reaction from which ozone and an activated oxygen result. By causing this ozone and activated oxygen to contact the surface of the article to be treated, the surface of the article is oxidized. An even higher treatment rate can be achieved by generating the activated oxygen with the simultaneous use of a far ultraviolet ray source, thereby increasing the activity of the activated oxygen. Advantageously, the oxidation of the article to be treated with the vacuum ultraviolet rays and far ultraviolet rays is performed in accordance with the relationship:

$$(p \times d)/(1+I^{1/2}) = 0.33$$

where I is a radiation density (mW/cm$^2$) of the far ultraviolet rays on a surface of the article to be treated in which there is no light absorption between the far ultraviolet ray source and the surface of the article to be treated, d is a shortest distance (cm) of passage of the vacuum ultraviolet rays emitted from the dielectric barrier discharge lamp to the surface of the article to be treated, and p is an oxygen partial pressure (atm) of the oxygen-containing gas, which is present between the dielectric barrier discharge lamp and the article to be treated.

15 Claims, 6 Drawing Sheets

| d \ P | 0.1 | 0.2 | 0.3 | 0.4 | 0.5 | 0.6 |
|---|---|---|---|---|---|---|
| 0.5 | 16 | 12 | 12 | 10 | 8 | 12 |
| 1 | 15 | 34 | 36 | 46 | 52 | 75 |
| 1.5 | 33 | 40 | 47 | 64 | 80 | 108 |
| 2 | 42 | 55 | 73 | 102 | 155 | 180 |
| 3 | 54 | 79 | 140 | 210 | 217 | 350 |
| 5 | 62 | 115 | 206 | 400 | 470 | 590 |

| Radiation Intensity at 254 nm | P \ d | 0.1 | 0.2 | 0.4 | 0.6 |
|---|---|---|---|---|---|
| 70 mW/cm² | 0.5 | 10 | 9 | 0 | 9 |
| | 1 | 9 | 26 | 36 | 45 |
| | 2 | 29 | 34 | 59 | 139 |
| | 3 | 46 | 51 | 122 | 161 |
| 25 mW/cm² | 0.5 | 13 | 9 | 8 | 12 |
| | 1 | 14 | 30 | 40 | 68 |
| | 2 | 31 | 42 | 81 | 122 |
| | 3 | 43 | 65 | 140 | 168 |
| 8 mW/cm² | 0.5 | 15 | 10 | 8 | 12 |
| | 1 | 14 | 29 | 40 | 67 |
| | 2 | 35 | 55 | 100 | 124 |
| | 3 | 56 | 78 | 146 | 170 |

PROCESS FOR OXIDATION OF AN ARTICLE

BACKGROUND OF THE INVENTION

1. Field of the Invention

The invention relates to a process for oxidizing an article, especially a process for the oxidation coating of a surface of a metal or a semiconductor material. The invention furthermore relates to a process for removal of oxidation from articles, such as dry precision cleaning or the like.

More specifically, the invention relates to a process for the removal of impurities of organic compounds which have accumulated on a surface of a metal or a glass plate as well as to a process for elimination of unnecessary photoresist on a silicon wafer in a production process for a semiconductor device.

2. Description of Related Art

Recently a treatment technique was developed and introduced into practice, in which the interaction of ultraviolet light with ozone is used in a process for removing organic impurities which have accumulated on a surface of a metal, glass or the like without damaging the articles being treated, and in a process for formatting an oxide layer on the pertinent surface.

A technique of this type is described for example in the handbook "New Technology for Ozone Use" (San Yu Shobo Verlag. Nov. 20, 1986, Chapter 9, p. 301 to 313; hereinafter called "Document A") including the principle underlying it, its devices, its cleaning effect, its applications and the like.

It can be taken from this publication that when oxygen or oxygen-containing air is radiated with light of 185 nm wavelength, which is emitted by as a vacuum ultraviolet ray from a mercury low pressure lamp, ozone is generated with it. In this case, furthermore, some of the ozone generated is decomposed by light of a 254 nm wavelength (which is a far ultraviolet ray emitted from the same mercury low pressure lamp), into an activated oxygen which is a decomposed gas of ozone, and the activated oxygen is brought into contact with the surface of the articles to be treated.

Removal of the organic impurities is done such that the organic impurities which have adhered to the surface of the articles to be treated, due to the above-described contact, are oxidized and changed into a low molecular oxide, such as carbon dioxide, water or the like. The low molecular oxide is removed from the surface of the articles to be treated, so that dry precision cleaning of the surface of the above-described articles to be treated can be performed.

Another process is performed such that ozone generated by an ozonizer is introduced directly into a treatment chamber, instead of generating ozone with 185 nm wavelength light, where it is irradiated and decomposed with 254 nm wavelength light (which is a far ultraviolet ray emitted from the mercury low pressure mercury lamp) to produce activated oxygen. The ozone and the activated oxygen are brought into contact with the surface of the articles to be treated, so that oxidation removal of the organic impurities on the above-described surface is obtained.

In the technique described in Document A, however, it is regarded as disadvantageous that, in the case when the ozonizer is not used, the ozone concentration decreases and that, therefore, to increase an absolute amount of ozone to be produced, a value $(d \times p)$ which is determined by a distance d (cm) of one passage of the ray with 185 nm wavelength and an oxygen partial pressure p (air pressure) had to be greater than/equal to a certain value. Specifically, at an oxygen partial pressure p of 0.2 atm., air pressure at a distance d of greater than or equal to 10 cm is necessary. This means that it ordinarily was, in fact, necessary that the value $(d \times p)$ be greater than 2. The technique described above, therefore, had the disadvantages that a large device was needed and that, at the same time, the treatment speed for oxidation removal of the organic impurities or the like is low because a high concentration of ozone cannot be obtained. Furthermore, it is regarded as disadvantageous that the conditions of use of the ozonizer were limited by the fact that it is inherently costly and thus causes financial problems.

The technique which uses the interaction of ultraviolet rays and ozone is, on the other hand, also used for a device for removing unnecessary photoresist on a silicon wafer, which is called a "photo asher". In this case, two processes, i.e., with and without use of the ozonizer, can be executed. However, in order to quickly remove a photoresist with a conventional thickness of, for example, roughly 1 micron, ultimately, it is, necessary to use the low pressure mercury lamp together with the ozonizer. Therefore, reference should, be made to the above-noted disadvantages of an expensive device, the high cost in the treatment process, and a large installation area and the like.

SUMMARY OF THE INVENTION

In view of the circumstances described above, a primary object of the present invention is, therefore, to obtain a high concentration of ozone, without use of an ozonizer, to produce activated oxygen from this ozone with a high efficiency to increase the rate of oxidation treatment of an article to be treated.

In conjunction with the foregoing object, it is a further object of the invention to devise a treatment process in which an inexpensive, small treatment device can be inherently obtained.

The above objects and others are achieved, according to a preferred embodiments of the invention, by an oxidation process in which:

(1) An oxygen-containing fluid is irradiated with a vacuum ultraviolet ray which is radiated from a dielectric barrier discharge lamp in which xenon gas is encapsulated. By means of a photochemical reaction, ozone and activated oxygen are produced. This ozone and activated oxygen are brought into contact with an article to be treated and the article to be treated, such as that described above, is oxidized.

(2) In addition, during execution of the above-described oxidation process according to step 1, the article to be treated is also directly irradiated with a vacuum ultraviolet ray emitted from the dielectric barrier discharge lamp, so that the article to be treated is oxidized by an interaction therewith.

(3) In addition, by irradiating the ozone and the activated oxygen with the far ultraviolet ray produced by the oxidation process according to item 1, above, activated oxygen is produced, and after increasing its activity, it is brought into contact with the article to be treated, so that the article to be treated is oxidized.

(4) An oxygen-containing fluid is, simultaneously, irradiated with a vacuum ultraviolet ray emitted from a dielectric barrier discharge lamp in which xenon is encapsulated, and with a far ultraviolet ray emitted from a far ultraviolet ray source. By means of a photochemical reaction, ozone and activated oxygen are produced. This ozone and activated oxygen are brought into contact with an article to be treated, and the article to be oxidized, so that it is oxidized.

(5) Furthermore, in the oxidation process described above according to step 4, a value of $(p \times d)/(1+I^{1/2})$ is determined to be less than 0.33, where I is a radiation density of the far ultraviolet ray on one material surface of the article to be treated is in units of mW/cm$^2$, d is the shortest distance of one passage of the vacuum ultraviolet ray emitted from the above-described lamp with respect to the oxygen-containing liquid present between the dielectric barrier discharge lamp and the article to be treated in centimeters, and p is an oxygen partial pressure relative to atmospheric pressure. In practice, to achieve a higher treatment rate than in prior art processes and to increase the economic benefit, it is desirable to cause the values of the parameters d and p to be such as to cause the value of $d \times p$ to be less than 0.6.

In accordance with an embodiment of the present invention, a double-cylindrical shape or a flat shape can advantageously be used as the shape of the dielectric barrier discharge lamp. It is, furthermore, desirable that an exit part for the vacuum ultraviolet ray is formed completely or partially of a material selected from the group which consists of synthetic quartz glass, sapphire, an alkali-metal halogenide or an earth alkali metal halogenide.

A mercury high pressure lamp, a mercury low pressure lamp, a krypton fluorine excimer lamp or a krypton fluorine excimer laser can be used as the source of the far ultraviolet ray. In addition, it is even more advantageous if the above-described article to be treated is radiated during its oxidation, at least with the vacuum ultraviolet ray and/or the far ultraviolet ray.

In the case of removing an unnecessary photoresist the article to be treated in the oxidation process is oxidized such that one surface layer of the surface described above or an oxide of the above-described material is removed as a gas from the above-described surface.

In a dielectric barrier discharge lamp, a discharge vessel is filled with a discharge gas which forms an "excimer" molecule, the excimer molecule formed by a dielectric barrier discharge (which is also known as an ozone production discharge or as a silent discharge, as is described in the *Discharge Handbook*, Elektrogesellschaft, June 1989, 7th edition, page 263) and light is emitted from the above-described "excimer" molecules.

By placing a dielectric, for which quartz glass or the like is used, in a discharge path, an essentially uniform density of the resulting ultraviolet rays is obtained. This is because formation of an arc discharge is suppressed and a concentration of the discharge in a particular location is prevented.

This dielectric barrier discharge lamp has some advantages, for example, the ultraviolet rays emitted have short wavelengths, e.g., 172 nm, and at the same time, single wavelength light is selectively produced with high efficiency, both of which are somewhat like line spectra. These advantages cannot be obtained by a conventional mercury low pressure lamp or a conventional high pressure arc discharge lamp.

Dielectric barrier discharge lamp are known (see, for example U.S. Pat. No. 4,837,484). According to the invention xenon-containing gas, especially pure xenon gas or a gas with xenon as the main constituent, is encapsulated in a discharge vessel as the discharge gas.

In the dielectric barrier discharge lamp, xenon atoms are excited and brought into an "excimer" state (Xe*$_2$). Upon dissociation from this excimer state, light with a wavelength of roughly 172 nm is again generated in the xenon atoms.

It was found that by radiation of oxygen with this light with a wavelength of 172 nm, ozone with a higher concentration can be obtained than by radiation of the oxygen with light of wavelength 185 nm emitted from the conventional mercury low pressure lamp. Furthermore, it was found that a high concentration of activated oxygen can be obtained from this ozone.

Moreover, a high concentration of activated oxygen can, likewise, be obtained from the ozone using light with a wavelength of 254 nm which is emitted from a mercury high pressure lamp or mercury low pressure lamp located next to the above-described dielectric barrier discharge lamp. In the following this principle is described based on chemical equations:

Ozone O$_3$ generation reaction from oxygen $$O_2 + h\gamma_1 \rightarrow O_3$$

Reaction of generation of activated oxygen O, O* from this ozone.

$$O_3 + h\gamma_1 \rightarrow O^* + 2O$$

$$O_3 + h\gamma_2 \rightarrow O^* + O_2$$

In this case one reaction per photon at a time is produced. In these equations $h\gamma_1$ and $h\gamma_2$ each designate light with a specific wavelength. This means that the oxygen or the ozone absorbs light of a specific wavelength.

The reaction generating ozone O$_3$ is caused by the oxygen O$_2$ absorbing light in a vacuum ultraviolet range with wavelengths of less than 200 nm. The degree of this absorption is generally called the absorption coefficient and changes continuously according to wavelength changes. However, within this continuous change this coefficient also exhibits an acute change which clearly occurs in a range of wavelengths greater than 150 nm. In particular, the absorption coefficient for the light of 172 nm wavelength is at least one decimal place greater than the absorption coefficient of the light with wavelength of 185 nm.

As a result, in the case of using a lamp which emits light with wavelength of 185 nm, a passage distance d of at least 20 cm is necessary, while when using a lamp which emits light with wavelength of 172 nm and the same radiation intensity as the preceding lamp, a passage distance d of roughly 1 cm is needed to obtain the same amount of ozone. This means that the ozone concentration (ppm) on the surface of the article to be treated for a lamp which emits light with wavelength of 172 nm is roughly one decimal place higher than for the lamp which emits ultraviolet light of a wavelength of 185 nm, even if the two lamps have the same radiation intensity.

The reaction of decomposition of ozone to generate the activated oxygen is, on the other hand, caused by the ozone O$_3$ absorbing the vacuum ultraviolet ray or far ultraviolet ray. This absorption by ozone O$_3$ for light with a wavelength of 250 nm is many time greater than that for light with a wavelength of 172 nm or 185 nm.

The activity of the activated oxygen is presumably greater in O* than in O. Therefore, by irradiating the activated oxygen with the far ultraviolet ray, its activity, for the most part, can be increased because a decomposition product with high activity can be increased.

Thus, a first significant feature of the process according to the invention for oxidation of an article to be treated is that ozone O$_3$ with a high concentration can be produced by the path-breaking measure in which a dielectric barrier discharge lamp is used which emits light with a wavelength of 172 nm as a vacuum ultraviolet ray with high efficiency.

A second significant feature of the process according to the invention for oxidation of an article to be treated is that by means of the simultaneous use of a lamp which emits light with a wavelength of 254 nm as the far ultraviolet ray, a high concentration of activated oxygen can be produced from the ozone $O_3$ with high efficiency, and at the same time, the activity thereof can be increased.

By oxidation of the article to be treated using the above-described features the treatment rate can be increased much more than in the conventional process.

Specifically, according to the invention, a concentration (ppm) of the activated oxygen can be obtained which is higher roughly by a power of ten than in the conventional process in which ozone $O_3$ is produced by light with wavelength of 185 nm, and in doing so, at the same time, the absorption of the light with wavelength of 254 nm by the ozone $O_3$ is effected.

According to the invention, therefore, the rate of oxidation of the article to be treated can be increased.

In this case the term "oxidation of an article to be treated" means both oxidation of one surface of the article to be treated, itself, and also oxidation of a material adhering to the article to be treated.

These and further objects, features and advantages of the present invention will become apparent from the following description when taken in connection with the drawings which, for purposes of illustration only, show several embodiments in accordance with the present invention.

DETAILED DESCRIPTION OF THE PREFERRED EMBODIMENTS

Figure 1:
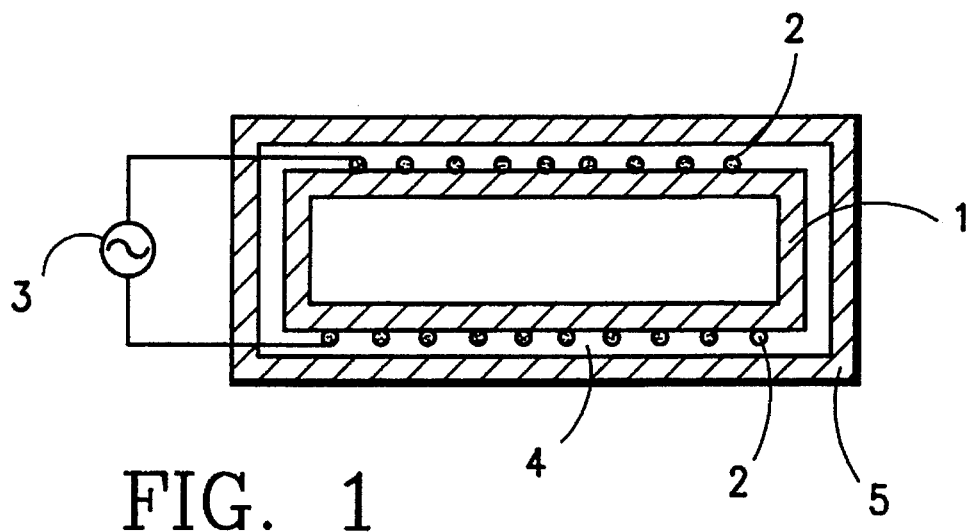
FIG. 1 shows a schematic representation of an example of a dielectric barrier discharge lamp with a flat shape used according to the invention.

FIG. 1 is a schematic representation of an example of a dielectric barrier discharge lamp used according to the invention, which will also be referred to herein as a "dbd lamp" for short. In the following description, if not indicated, distance units are in centimeters (cm), pressure units are in atmospheres (atm) and radiation densities/intensities in milliwatts per square centimeter ($mW/cm^2$).

In the figures, reference number 1 identifies a discharge vessel which is formed of synthetic quartz glass and which has a parallel plate shape. This shape is suitable for stack processing of a surface of an article to be treated since conventionally a host of articles to be treated have plate-like shape. For example, an inside dimension of 10 cm long×10 cm wide ×0.6 cm high may be used.

A net-like or latticework type electrode 2 formed of monel wire is located above and below the discharge vessel 1. Discharge vessel 1 is filled with xenon gas. When power is delivered by the current source 3 for electrode 2, a dielectric barrier discharge is formed within discharge vessel 1, for example, with a plasma length of 0.6 cm, in which the quartz glass functions as a dielectric. The quartz glass also functions as an exit part for the vacuum ultraviolet ray. Light with a wavelength of 172 nm is emitted from discharge vessel 1 to the outside as a vacuum ultraviolet ray produced from an excimer state obtained by the above-described discharge.

The treatment for removal of organic impurities according to the invention is generally done within an oxygen-containing atmosphere. It is therefore desirable that, in the dbd lamp, electrode 2 be jacketed, especially with a material which advantageously passes the vacuum ultraviolet ray, such as, for example, with synthetic quartz glass plate 5. Cavity 4, which is formed between discharge vessel 1 and quartz glass plate 5, is filled with nitrogen gas.

Within discharge vessel 1, besides the above-described encapsulation of the xenon gas alone, also neon, argon or the like can be encapsulated with xenon gas as the main constituent. The encapsulation pressure for the xenon gas is for example 300 torr. A voltage of for example 4 V 20 kHz is applied by the electrode 2.

Figure 2:
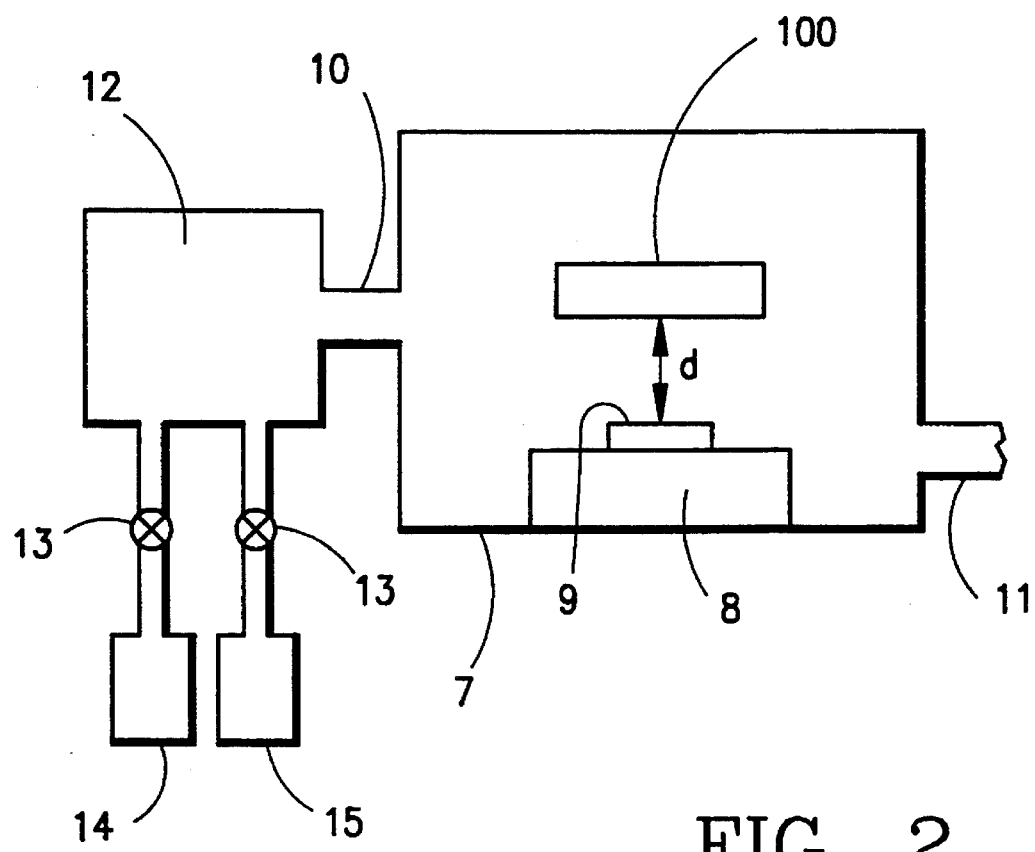
FIG. 2 shows a schematic representation of a device for performing the process for surface cleaning of a glass substrate of the present invention.

FIG. 2 illustrates a surface cleaning device for the article to be treated using the above-described dielectric barrier discharge lamp. Within treatment chamber 7 are a sample carrier 8 upon which an article 9 to be treated is seated and a dielectric barrier discharge lamp 100. Article 9 to be treated is, for example, of a glass substrate measuring 1 cm ×1 cm.

In addition, treatment chamber 7 has an inlet opening 10 and an exit opening 11 for an oxygen-containing gas. A nitrogen gas source 14 and an oxygen gas source 15 are connected to inlet 10, for example, via a mixing chamber 12 and a valve 13. In outlet the opening 11, a decomposition device for the discharged ozone is installed as required.

The reason for adding nitrogen gas, in this case, lies in regulating the cleaning efficiency by changing the partial pressure p of the oxygen.

Using the above-described device, activated oxygen can be produced, based on the above-described principle, by radiating the glass substrate, forming the article 9 to be treated, with light of wavelength of 172 nm from dbd lamp 100 and oxidation removal of the organic impurities adhering to the glass substrate can be obtained.

A distance d (cm) between a surface of dbd lamp 100 and a facing surface of the glass substrate, as well as the partial pressure p of oxygen within the treatment chamber 7, exert a great influence on the amount of activated oxygen produced and the cleaning effect on organic impurities. The oxygen partial pressure p is therefore regulated in mixing chamber 12, and sample carrier 8 is, at the same time, provided with a device for movement up and down (not shown). In this device, the dbd lamp 100 is operated, for example, with an electrical input power of 20 W and a light output power on the dbd lamp surface of 30 mW/cm$^2$.

Next, a test is described in which the cleaning rate of organic impurities using the device shown in FIG. 2 was studied by changing the distance d (cm) between the surface of dbd lamp 100 and the surface of the glass substrate, as well as the oxygen partial pressure p within the treatment chamber 7. In the test, dbd lamp 100 was operated with the electrical input (W) described above, and the above-described light output (mW/cm$^2$). In addition, a cleaning duration in this test was defined as follows:

The glass substrate was ultrasonically cleaned for roughly 5 minutes in isopropyl alcohol, hereinafter called IPA, so that a contact angle of 20 degrees relative to the water is attained.

One such glass substrate was subjected to the cleaning process according to the invention. In this way a time interval up to reaching an angle of 3 degrees was defined as the cleaning duration T (seconds).

Figure 12:
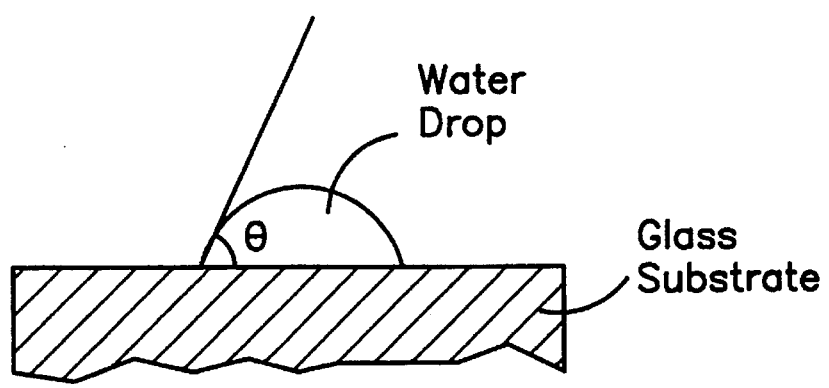
FIG. 12 shows a schematic representation which describes the state of a water droplet on a glass substrate.

The expression "contact angle with reference to water" will be defined as angle θ which is formed by a water droplet on the glass substrate, as shown in FIG. 12 and which has a major relation to the degree of cleaning of the surface of the glass substrate. This circumstance is described in the above-described publication A on pages 308 to 313.

The contact angle of 3 degrees determined in this case designates a state from the mentioned publication A on page 309 in which organic impurities have a layer thickness of less than or equal to 0.1 molecular layer. In this case, there are presumably only a few molecules adhering in the manner of islands to the glass substrate, and it can be concluded therefrom that sufficient cleaning was effected.

Figures 3, 4:
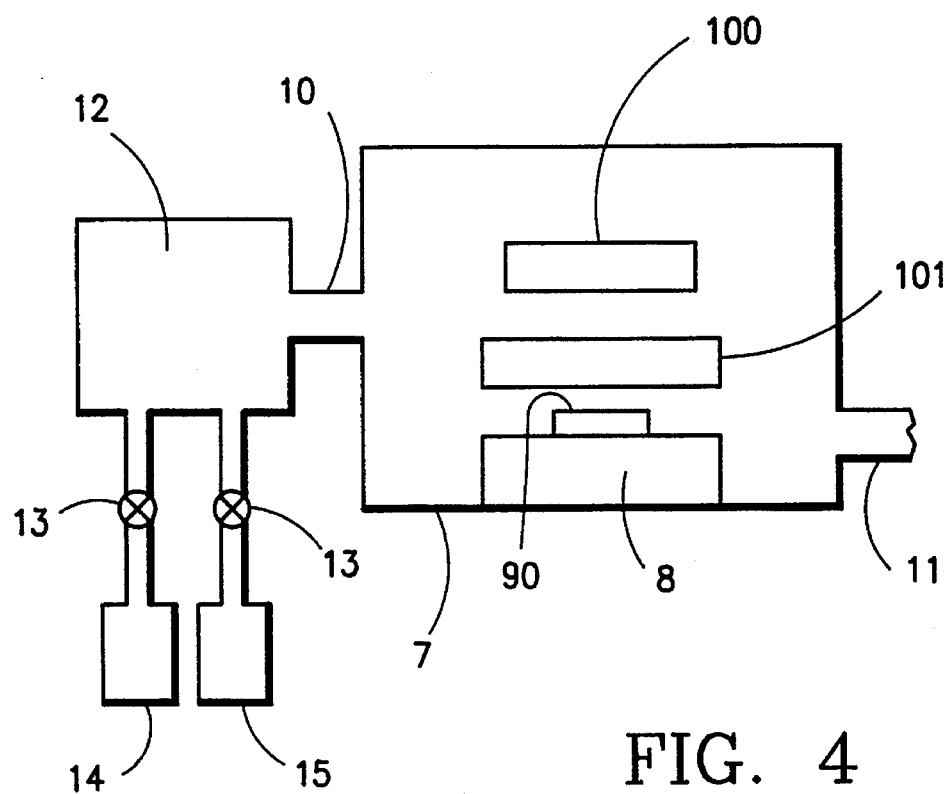
FIG. 3 shows a table of data which describes the results of surface cleaning tests using the device shown FIG. 2.
FIG. 4 shows a schematic representation of a device for performing another process for surface cleaning of a glass substrate in accordance with the invention.

The adjustment angle of 20 degrees before the test designates, on the other hand, a state in which the organic impurities have a layer thickness of greater than or equal to one molecule and a monomolecular layer adheres to one surface of the glass substrate in a widely dispersed manner. FIG. 3 shows the results of the test. Numerical values in the table designate cleaning duration T in seconds. The "p" in the table designates the oxygen partial pressure within the treatment chamber 7 based on the relationship $(1-p)N_2+pO_2$ and a 1 atm. total pressure in the treatment chamber 7.

Furthermore, for comparison purposes, instead of dielectric barrier discharge lamp 100, a mercury low pressure lamp with an electrical input power of 450 W was used to run the same test. With this mercury low pressure lamp the cleaning duration T was roughly 200 seconds, in spite of optimum conditions with an oxygen partial pressure p of 0.2 atm. and a distance d of 12 cm. Furthermore, the cleaning duration T under the conditions represented in FIG. 3, i.e., at oxygen partial pressure p from 0.1 to 0.6 atm. and distance d from 0.5 to 5.0 cm was greater than or equal to 200 seconds in a number of instances.

A cleaning duration T at which, presumably, a considerable economic effect is achieved is generally less than or equal to 60 seconds. If a cleaning duration T of less than or equal to 60 seconds is designated the allowable duration, it is apparent from the results shown in FIG. 3 that treatment can be done within the allowable cleaning duration if a value of d (distance)×p (oxygen partial pressure) is less than or equal to about 0.6 (using cm, atm. units).

In this test, nitrogen gas was used as the gas which is mixed in together with the oxygen. The cleaning duration T, however, was within the variance of test data, even if the same tests were run using an inert gas, such as argon (Ar), krypton (Kr) or the like, instead of using nitrogen gas.

FIG. 4 schematically shows another example of a surface cleaning device for an article to be treated using a dielectric barrier discharge lamp. This device has, in addition to the dielectric barrier discharge lamp 100, along four sides thereof, a far ultraviolet ray source assembly 101 which consists of a mirror and a mercury low pressure lamp.

The oxygen gas which flows in the vicinity of glass substrate 90, therefore, absorbs both the vacuum ultraviolet ray from the dielectric barrier discharge lamp 100 and also the far ultraviolet ray from the far ultraviolet ray source assembly 101. The above-described dielectric barrier discharge lamp is, furthermore, installed in a device for moving it up and down (not shown) in order to change the distance d between dielectric barrier discharge lamp 100 and glass substrate 90.

The expression "vacuum ultraviolet ray emitted from dielectric barrier discharge lamp 100" is defined as light in a wavelength range from 1 nm to 200 nm while the expression "far ultraviolet ray emitted from far ultraviolet ray source assembly 101" is defined as light in a wavelength range from 200 nm to 370 nm.

Next, using this device, cleaning tests were run with a glass substrate as in the above-described example. In these tests, the cleaning duration T in seconds was measured using illumination intensities, at the surface of the glass substrate 90, for the light 254 nm wavelength, far ultraviolet ray of 70 mW/cm$^2$, 25 mW/cm$^2$ and 8 mW/cm$^2$ and changing the distance d and the oxygen partial pressure p at each illumination intensity.

Furthermore, the radiation intensity of the vacuum ultraviolet ray from the dielectric barrier discharge lamp 100 on a surface of the exit part for the vacuum ultraviolet ray, i.e., a lower part of dbd lamp 100, was set to 30 mW/cm$^2$.

The illumination intensity of the far ultraviolet ray with 254 nm wavelength in this case is a value measured beforehand in a state in which p=0. The illumination intensity is measured in one such state since an amount of light which reaches as far as the glass substrate changes according to the value of the oxygen partial pressure p.

Figures 5, 6:
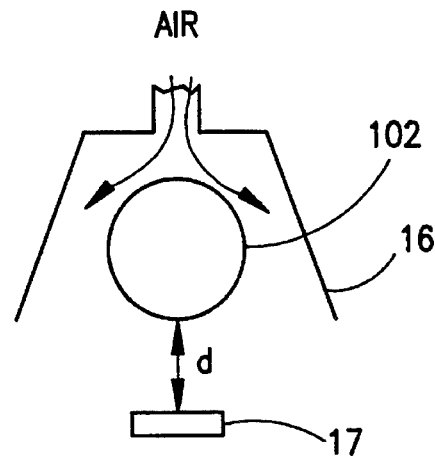
FIG. 5 shows a table of data which describes the results of surface cleaning tests using the device shown in FIG. 4.
FIG. 6 shows a schematic representation of an embodiment of an oxidation removal process for organic impurities on a metal surface.

FIG. 5 shows the test results from which it was derived that it is desirable that $(d\times p)/(1+I^{1/2})$ should have a value of less than 0.1 in order to achieve a cleaning duration of less than or equal to 60 seconds as the allowable cleaning duration T. In this case "I" designates the radiation intensity of the far ultraviolet ray on a surface of the article to be treated or the surface of a material on the above-described surface if there is no light absorption between the far ultraviolet ray source and the surface.

In these tests dielectric barrier discharge the lamp 100 was operated with an illumination intensity of 30 mW/cm$^2$ on the dbd lamp surface. An illumination intensity of the vacuum ultraviolet ray with a 172 nm wavelength can, however, in reality be increased also in the case of a natural air cooling to 300 mW/cm$^2$.

The inventor has found that, in luminous operation of the above-described dbd lamp with such a high power, a sufficient cleaning treatment within the allowable duration can be effected even if the above-described value of $(d\times p)/(1+I^{1/2})$ is less than 0.33.

FIG. 6 shows an schematic representation of an oxidation removal process for organic impurities adhering to a metal surface according to the oxidation process wherein an oxygen-containing fluid is irradiated with a vacuum ultraviolet ray which is emitted from a dielectric barrier discharge lamp in which xenon gas is encapsulated, so that, by means of a photochemical reaction, ozone and an activated oxygen are produced, and oxidation of article to be treated is produced by contact with this ozone and activated oxygen, especially where the article to be treated is also irradiated, at the same time, with the above-described vacuum ultraviolet ray and by the interaction therewith is oxidized.

That is, as shown here, by means of the vacuum ultraviolet ray of 172 nm wavelength emitted from the dielectric barrier discharge lamp 102, ozone as well as activated oxygen are produced, by which an oxidation removal process for organic impurities adhering to a metal surface is effected. Here, in the oxidation removal process schematically shown, the metal surface is irradiated directly with the 172 nm wavelength vacuum ultraviolet ray light and the organic impurities are removed by an interaction therewith.

The device has an arrangement in which dielectric barrier discharge lamp 102 is located in an aluminum mirror 16, the surface of which is coated with magnesium fluoride. Under the dbd lamp 102 is the article to be treated that has organic impurities adhering to its surface, which in this case is an aluminum sheet 17. The distance between this aluminum sheet 17 and the dbd lamp 102 is, for example, 10 cm. As the dbd lamp 102, the dbd lamp shown in FIG. 1 can be used. For this purpose, however, a dbd lamp with a double-cylindrical shape as described below can be used.

Mirror 16 has an atmosphere by which, via an inflow of air from above the mirror 16, the dbd lamp 102, mirror 16 and the like can be cooled overall, the air flowing in a direction onto aluminum sheet 17. The atmosphere has a total pressure of roughly 1 atm, and an oxygen partial pressure of for example roughly 0.25 atm.

By means of the arrangement just described, light with 172 nm wavelength, as the vacuum ultraviolet ray, is emitted with high efficiency from the xenon-gas containing dbd lamp 102, and with which the oxygen in the inflowing air is radiated. This produces a photochemical reaction by which ozone is generated and which, likewise, is irradiated with the above-described vacuum ultraviolet ray. Activated oxygen is produced by this radiation.

Organic impurities which adhere to the aluminum sheet 17 can be advantageously removed by contacting of the activated oxygen with aluminum sheet 17. In this embodiment, by means of mirror 16, the oxygen gas can be directed onto aluminum sheet 17 with high efficiency, and at the same time, aluminum sheet 17 can be directly irradiated or its vicinity irradiated with light reflected by mirror 16 and with light projected directly from dbd lamp 102, so that a photochemical reaction can thus be produced. As a result, an especially high cleaning effect can be achieved.

In the following, an example is described from which the effect achieved by this process becomes apparent.

In luminous operation of dbd lamp 102 with an electrical input power of 20 W and with irradiation of aluminum sheet 17 with light with 172 nm wavelength light (as the vacuum ultraviolet ray emitted from the dbd lamp) for a duration of 40 seconds, a contact angle of the aluminum sheet with reference to water was reduced from an initial value of 40° to 10°. If organic impurities can be removed up to such a degree, a thickness sufficient for practical use can be obtained even if printing ink is adhering to a cleaned surface of aluminum sheet 17.

The same effect could, furthermore, be obtained by reducing the distance d between aluminum sheet 17 and dbd lamp 102 to 0.3 cm and by radiation of the 172 nm wavelength light for roughly 13 seconds.

Figure 7:
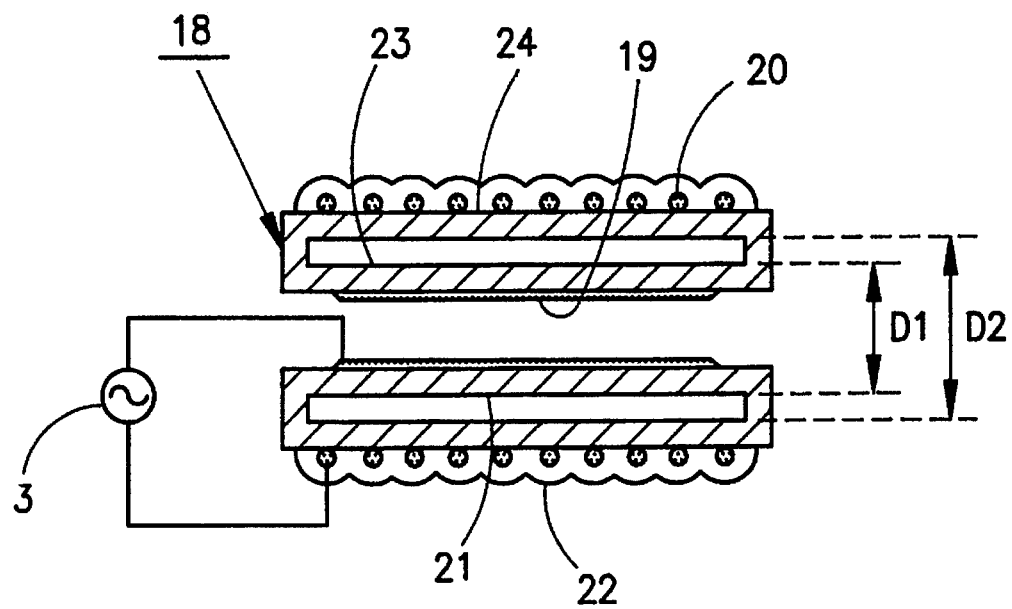
FIG. 7 shows a schematic representation of an example of a dielectric barrier discharge lamp of the double cylinder type used according to the invention.

FIG. 7 illustrates one example of a dielectric barrier discharge lamp 102 of the double cylinder type. Discharge vessel 18 is shaped roughly like a hollow cylinder such that inner tube 23 of quartz glass and outer tube 24 of quartz glass are located coaxially with respect to one another. Outer tube 24 has the functions both of a dielectric and also as a light exit part of the dielectric barrier discharge lamp 102.

An outer surface of the inner tube 23 is provided with an aluminum film electrode 19 which also serves as a reflector film. An outer surface of the outer tube 24 is provided with a net-like or latticework type electrode 20 of metal for passage of the light. Discharge space 21 is filled with xenon as the discharge gas. The net-like or latticework type electrode 20 is, furthermore, provided with an electrode anti-oxidation coating 22 which can also be used to advantage for electrode 19, although it is not shown in the drawing.

The dielectric barrier discharge lamp of the double cylinder type with the above-described shape is generally, in the case of surface treatment of a wound film, suited for uninterrupted surface treatment of the film by moving the film across the dbd lamp in a direction perpendicular to its longitudinal axis.

Discharge vessel 18 has, for example, a total length of roughly 100 mm, an outside diameter $D_1$ of inner tube 23 of 6 mm and an inner diameter $D_2$ of the outer tube 24 of 8 mm. Inner tube 23 and outer tube 24 are formed, for example, of quartz glass containing the OH radical in a weight less than or equal to 700 ppm.

Figure 8:
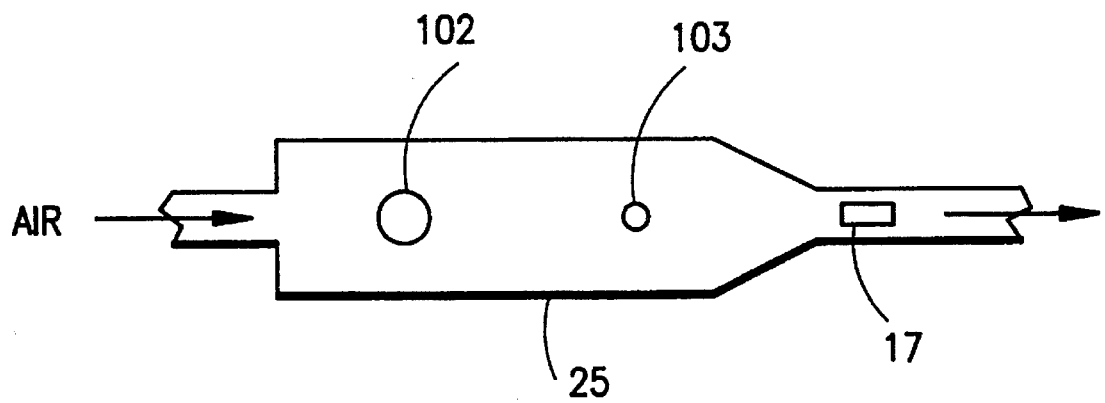
FIG. 8 is a schematic representation of another embodiment of an oxidation removal process for organic impurities on a metal surface.

FIG. 8 is a schematic representation of an oxidation removal process for organic impurities adhering to a metal surface wherein, an oxygen-containing fluid is irradiated with a vacuum ultraviolet ray which is emitted from a dielectric barrier discharge lamp in which xenon gas is encapsulated, and wherein, by means of a photochemical reaction, ozone and an activated oxygen are produced with activity which is increased by irradiation with a far ultraviolet ray, so that the article to be treated is oxidized by contact with the above-described ozone and the activated oxygen with increased activity.

This means that, in this case, the vacuum ultraviolet ray emitted from the dielectric barrier discharge lamp with a 172 nm wavelength produces ozone and activated oxygen which are irradiated with the far ultraviolet ray having a wavelength of 254 nm. By producing activated oxygen by the above-described radiation, and by increasing its activity, oxidation removal of organic impurities on a metal surface is effected.

The device has an arrangement in which dielectric barrier discharge lamp of the double cylinder type 102 and mercury low pressure lamp 103 are arranged within reaction a tube 25 having an essentially flat shape. The axes of the lamp tubes run parallel to one another at a distance from one another and crosswise to the flow direction through the reaction chamber 25 that is represented by arrows in FIG. 6, with the dbd lamp 102 being located upstream of the mercury lamp 103 in the direction of air flow so that the air flows from the dbd lamp 102 to the mercury lamp 103.

The article to be cleaned, e.g., the aluminum sheet 17, is located downstream of mercury lamp 103. It is certainly not necessary that aluminum sheet 17 be irradiated directly with the radiant light from the dbd lamp 102 and mercury lamp 103. However, depending on its location, the far ultraviolet ray from mercury low pressure lamp 103 can also be absorbed.

The distance between the dbd lamp 102 and the mercury lamp 103 is, for example, 15 cm. The inflowing air has a pressure of roughly 1 atm. The dbd lamp 102 is operated with an electrical input power of 20 W, while lamp 103 is operated with an electrical input power of 450 W.

By means of the above-described arrangement, the air which has flowed into reaction tube 25 absorbs the 172 nm wavelength light emitted from the dbd lamp 102 upstream within the reaction tube. By means of a photochemical reaction of the oxygen, ozone is produced from which activated oxygen is, likewise, produced. This ozone and activated oxygen are blown downstream, and at the same time, absorb the 254 nm wavelength light and also the far ultraviolet ray emitted from mercury lamp 103, and thus even more increase their activity. Oxidation removal of the organic impurities adhering to the surface of aluminum sheet 17 can be produced by bringing the ozone and the activated oxygen into contact with the aluminum sheet 17 located downstream.

In the following, an example is described from which the effects achieved by this process become apparent:

By means of a treatment lasting about 36 seconds, it was possible to reduce the contact angle of aluminum sheet 17 with respect to the water from an initial value of 40 degrees to 10 degrees. Using aluminum sheet 17 after this cleaning process, a thickness sufficient for practical use could be maintained even if printing ink or the like has adhered to the surface thereof.

Figure 9:
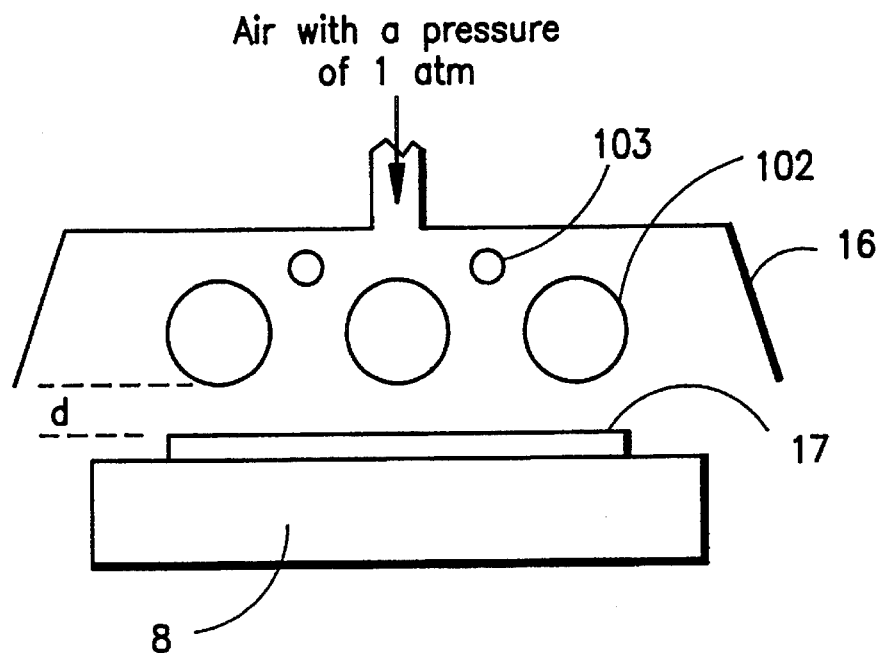
FIG. 9 shows a schematic representation of still another embodiment of an oxidation removal process for organic impurities on a metal surface.

FIG. 9 is a schematic representation of an oxidation removal process for organic impurities adhering to a metal surface according to the oxidation process wherein an oxygen-containing fluid is irradiated with a vacuum ultraviolet ray which is emitted from a dielectric barrier discharge lamp in which xenon gas is encapsulated and with a far ultraviolet ray which is emitted from a far ultraviolet ray source, producing ozone and an activated oxygen by means of a photochemical reaction, oxidation of the article to be treated being produced by the article being contacted with this ozone and activated oxygen and especially where, during the oxidation of the article by the ozone and activated oxygen, it is also irradiated with a vacuum ultraviolet ray and/or far ultraviolet ray.

In this case, ozone and activated oxygen are produced by the 172 nm wavelength vacuum ultraviolet ray emitted from the dielectric barrier discharge lamp and are brought into contact with a metal surface which has organic impurities. The metal surface is, at the same time, irradiated with the far ultraviolet ray of 254 nm wavelength light emitted from a mercury low pressure lamp located next to the dielectric barrier discharge lamp. This means that, in doing this, oxidation treatment using two lamps, i.e., the dielectric barrier discharge lamp and the mercury low pressure lamp, is effected and that, at the same time, at least one of the two lamps directly irradiates the metal surface.

The device has an arrangement in which, in a mirror 16, there are three dielectric barrier discharge lamps of the double cylinder type 102 in roughly one plane and also two mercury low pressure lamps 103 parallel to the plane formed by lamps 102 and likewise, roughly in one plane. In this case, the term "parallel" will be defined as the axes of the lamp tubes of the dbd lamps being parallel to one another. The dbd and mercury lamps are, viewed from a direction of the tube axes, arranged zig zag to one another, i.e., with the mercury lamps 103 above or below the gaps between the dbd lamps 102.

For mirror 16, the same type of mirror can be used as in FIG. 6. Treatment is performed such that the dbd lamp or lamps 102 and the, for example, aluminum sheet 17, are brought close to one another until a distance between the two is, for example, roughly 0.3 cm.

On a surface of the aluminum sheet 17 sites are formed which are irradiated with the 254 nm wavelength far ultraviolet ray emitted from lamp 103, and sites which are not irradiated with this light are formed. On aluminum sheet 17, furthermore, nonuniformity of the illumination strength (illumination intensity) occurs also for the 172 nm wavelength vacuum ultraviolet ray emitted from the dbd lamp 102. Sample carrier 8, on which aluminum sheet 17 is seated, can therefore be moved, for example, with an amplitude of 3 cm and 4 Hz. By arrangements of dbd lamp 102 and lamp 103 as well as by selection of this amplitude, absorption of the far ultraviolet ray is regulated, achieving uniformity of the illumination strength (illumination intensity) of the vacuum ultraviolet ray on aluminum sheet 17.

By means of the above-described arrangement, aluminum sheet 17, seated on sample carrier 8, absorbs the 172 nm wavelength vacuum ultraviolet ray emitted from dbd lamp 102. In this way, a photochemical reaction is caused in the oxygen which is contained in the air, and thus, ozone and activated oxygen are formed. Furthermore, by simultaneous absorption of the 254 nm wavelength far ultraviolet ray emitted from the mercury lamp 103, the activity of the above-described ozone and activated oxygen is increased, and oxidation removal of organic impurities on aluminum sheet 17 is effected.

This process achieves the effect that, for luminous operation of the respective dbd lamp 102 with an electrical input power of 20 W and mercury lamp 103 with an electric input power of 450 W, with a duration of roughly 6 seconds, it was possible to reduce the contact angle of aluminum sheet 17 with reference to the water from 40° to 10°.

The above-described embodiments relate to oxidation removal of organic impurities adhering to the surface of the aluminum sheet.

Next, using a device with an essentially identical arrangement as the device shown in FIG. 9 oxidation removal of a photoresist applied to a semiconductor wafer, i.e., so-called photo ashing, is described.

In this case, in sample carrier 8, a heating device, such as a heater or the like, and a tube are arranged, which lets cooling water flow. In this way, the temperature of the semiconductor wafer can be increased to a predetermined temperature and by radiating the photoresist with the radiant light from the dbd lamp 102 and mercury lamp 103, in the above-described manner, ashing treatment can be done.

For example, a semiconductor wafer on which a photoresist (type OMR 83 from Tokyo Ooka Kogyo A. G.) was applied in a thickness of 1 micron was heated to 200 degrees C and treated. In this case, ashing could be done at a rate of 15 nm per second.

Next, using essentially the same device as the one shown in FIG. 9, a process for formation of a silicon oxide film on one surface of a semiconductor wafer will be described.

A silicon wafer, as the article to be treated, was seated on sample carrier 8. Five dielectric barrier discharge lamps 102 and four mercury low pressure lamps 103 were arranged in the above-described zig-zag manner. Sample carrier 8 was heated to 400 degrees C., for example, and moved back and forth at 5 Hz. In this way, a thick film of silicon oxide with a thickness of 10 nm was be formed on the silicon wafer, and it was possible to attain this treatment in 2 hours.

The device for forming an oxide layer in this embodiment can, by a device not shown in FIG. 9, utilize a stable, constant regulation of a fluid present between the dbd lamp and the article to be treated for removing the organic impurities or unnecessary photoresist by blowing out these waste products.

Formation of a thin oxide layer on the surface of the silicon wafer is usually done in a process of formation of an insulating layer in the manufacture of a semiconductor device. The conventional process, however, is effected by means of an electric furnace with high humidity and heating at a high temperature of, for example, 850° to 1000° C. On the other hand, by means of the process according to the invention, for formation of the oxidation coating, an oxidation coating with good quality can be obtained at a much lower humidity and a much lower temperature compared to the conventional process.

Figure 10:
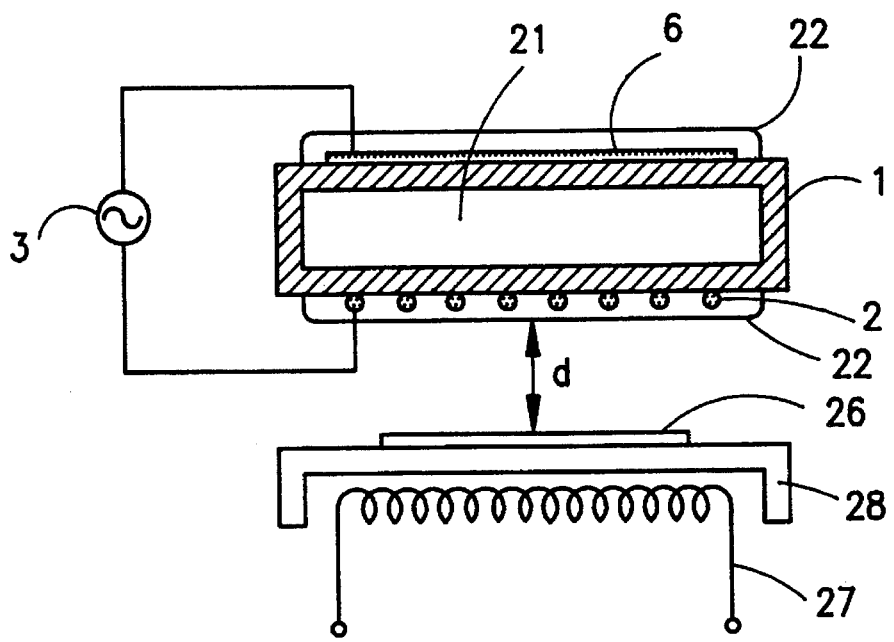
FIG. 10 shows a schematic representation of a process for the cryooxidation of a silicon wafer.

Next, using FIG. 10, another embodiment of the process for formation of the oxidation coating on the silicon wafer is described.

A quartz glass flat discharge vessel 1 of a dielectric barrier discharge lamp has an interior discharge space 21. Discharge vessel 1 is filled with xenon gas in order to produce the 172 nm wavelength vacuum ultraviolet ray. On the outside of discharge vessel 1 are electrodes 2 and 6. Due to the single direction of exit of the radiant light, electrode 6 is an aluminum film which also functions as a mirror, while the electrode 2 is a net-like or latticework electrode through which light can pass. In this way, emergence of the radiant light with high efficiency can be achieved. The quartz glass is, furthermore, provided with antioxidation coating 22 because this device is used within an oxygen-containing atmosphere.

Sample carrier 28 is formed of quartz glass on which silicon wafer 26 is seated, and within it a heating apparatus 27 is installed for purposes of heating. In this dielectric barrier discharge lamp, discharge vessel 1 is made of, for example, quartz glass with a thickness of 1 mm and having inner dimensions of 20 cm×20 cm×0.6 cm.

In a device of this type, within the atmosphere, a distance d (cm) between the dbd lamp and the silicon wafer 26 is set to 0.2 cm and the dbd lamp is operated by means of power source 3 which is regulated such that the intensity of the 172 nm wavelength light emitted from the dbd lamp at one dbd lamp surface is roughly 100 mW/cm$^2$. In this case, the dbd lamp has an electrical input power of for example 400 W. In this regard, a test was run in which, by changing the controlled temperature of heating apparatus 27, a dense silicon oxide film with a thickness of 10 nm was produced on silicon wafer 26. The controlled temperature of heating apparatus 27 can be increased at most to 600 degrees C.

It was found here that silicon oxide with a thickness of 10 nm can be produced in roughly 1.5 hours if silicon wafer 26 is kept constantly at roughly 450 degrees C using heating apparatus 27, and the same silicon oxide can be produced in roughly 40 minutes with the silicon wafer 26 held at a constant temperature of 500 degrees C. From this it becomes apparent that, according to the invention, an adequate insulating film of silicon oxide can be produced at a much lower temperature than in the conventional process by high temperature oxidation.

In the following, the dielectric barrier discharge lamp in which the xenon gas is encapsulated is further described.

Since a dielectric barrier discharge lamp emits a vacuum ultraviolet ray in a wavelength range of less than 200 nm, a discharge vessel must consist of a dielectric which passes light in the above-described wavelength range. However, it stands to reason that the light emerging part of the dbd lamp is pointed in all directions or in a single certain direction of the dpd lamp depending on the application. An arrangement in which at least the exit part for the above-described light passes the light in the above-described wavelength range is, therefore, adequate. For the above-described exit part, furthermore, not only material of synthetic quartz glass, but also sapphire, a single crystal of an alkali metal halogenide or of an earth alkali metal halogenide can be used. Moreover, a part of the discharge vessel from which the above-described ultraviolet ray does not emerge can be provided with a reflector coating or an electrode which also has the function of a reflector coating.

Still further, for a far ultraviolet ray source which emits the far ultraviolet ray in a wavelength range from 200 nm to 300 nm, not only the above-described mercury low pressure lamp, but also a mercury high pressure lamp which emits light in this wavelength range, a krypton-fluorine excimer lamp or krypton-fluorine excimer laser which emits light in a wavelength range from 240 nm to 255 nm can be used.

Figure 11:
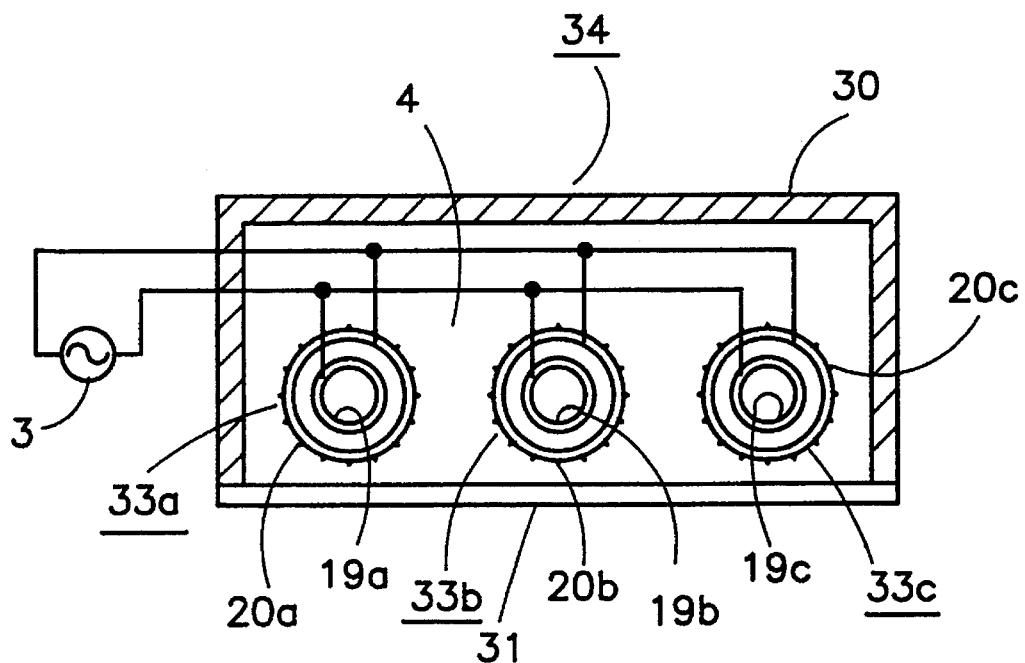
FIG. 11 shows a schematic representation of a light source device using a dielectric barrier discharge lamp of the double cylinder type.

FIG. 11 shows a lamp device including dielectric barrier discharge lamps. Instead of a discharge vessel 1 with the parallel plate shape shown in FIG. 1, this lamp device has dielectric barrier discharge lamps of the double cylinder type 33a, 33b, and 33c, which have similar arrangements to the dielectric barrier discharge lamps shown in FIG. 7. In this lamp device, furthermore, instead of the cover formed by the synthetic quartz glass plate 5 shown in FIG. 1, there is plate-shaped structure 34 formed of a metal vessel 30 that which also functions as a light reflector disc and is provided with light exit window 31 made of synthetic quartz glass.

Dielectric barrier discharge lamps of the double cylinder type 33a, 33b, and 33c have, for example, an outer diameter of 26.6 mm, a discharge gap of 5 mm and a total length of 300 mm. Xenon with roughly 40 kPa is used as the discharge gas.

In a dielectric barrier discharge effected using this lamp device, a vacuum ultraviolet ray is emitted with high efficiency with a center at a wavelength of 172 nm. In addition, by the measure in which a few liters of nitrogen gas per minute are allowed to flow into cavity 4, a practical, plate-like ray source device is obtained since not only latticework electrodes 20a, 20b, 20c, and electrodes 19a, 19b and 19c are protected, but also absorption of the vacuum ultraviolet ray in cavity 4 no longer occurs. In this embodiment, there is the advantage that an inexpensive plate-like light source device can be obtained, because use of a plurality of costly, synthetic quartz glass plates is not necessary.

The oxidation process for the article to be treated according to the invention can, moreover, be used as an oxidation treatment of a metal surface for eloxal treatment of aluminum, surface oxidation treatment as pretreatment for a printing process on stainless steel, and furthermore, for oxidation treatment to increase the transparency of a metal oxide sputtered on a glass plate.

The process of cleaning a glass surface according to the invention can, furthermore, be used for precision cleaning, for pretreatment before electrode classification, and line laying on glass of a liquid crystal display.

Moreover, the technique according to the invention can also be used to increase the thermal compressive strength of gold.

Application of the Invention

By means of the oxidation process for an article to be treated according to the invention, by using a dielectric barrier discharge lamp which emits a vacuum ultraviolet ray with a wavelength of 172 nm, in the vicinity of the surface of the article to be treated, ozone as well as activated oxygen can be produced with a high concentration. According to the invention, therefore, the rate of oxidation of the article to be treated is greatly increased.

Furthermore, by means of the measure according to the invention, by which ozone and the activated oxygen are irradiated with the far ultraviolet light with a wavelength of 254 nm, activated oxygen which can be produced with a higher efficiency and at the same time its activity increased. As a result rapid oxidation treatment of the article to be treated can be performed, and at the same time, the treatment device can be made smaller. Moreover, according to the invention an inexpensive treatment process can be achieved since no ozonizer is used.

It is to be understood that although preferred embodiments of the invention have been described, various other embodiments and variations may occur to those skilled in the art. Any such other embodiments and variations which fall within the scope and spirit of the present invention are intended to be covered by the following claims.

We claim:

1. Process for oxidation of an article to be treated, comprising the steps of:

disposing the article to be treated in a treatment chamber containing an oxygen-containing gas; and irradiating oxygen-containing gas with vacuum ultraviolet rays having a wavelength of about 172 nm by emitting the vacuum ultraviolet rays from a dielectric barrier discharge lamp in which xenon gas is encapsulated and is in an excimer state;

producing ozone and an activated oxygen from a photochemical reaction between the oxygen-containing gas and the vacuum ultraviolet rays; and oxidizing the article to be treated by contacting the article with the ozone and the activated oxygen produced by said photochemical reaction.

2. Process for oxidation of an article to be treated according to claim 1, wherein said oxidizing step further comprising the step of irradiating the article to be treated with the vacuum ultraviolet rays during said oxidizing step so as to oxidize the article to be treated by interacting the vacuum ultraviolet rays therewith during oxidation of the article to be treated by said ozone and the activated oxygen.

3. Process for oxidation of an article to be treated according to claim 2, comrising the further step of setting a shortest distance d (cm) of passage of the vacuum ultraviolet rays emitted from the dielectric barrier discharge lamp and an oxygen partial pressure p (atm.) of the oxygen-containing gas in said treatment chamber, which is present between the dielectric barrier discharge lamp and the article to be treated, to produce a value of d×p that is less than 0.6.

4. Process for oxidation of an article to be treated according to claim 1, comprising the further step of increasing the activity of the ozone and the activated oxygen produced by said photochemical reaction by irradiation thereof with far ultraviolet rays prior to performing of said oxidizing step so that the article to be treated is oxidized by contact with the ozone and the activated oxygen after their activity has been increased.

5. Process for oxidation of an article to be treated according to claim 4, wherein said oxidizing step further comprising the step of irradiating the article to be treated with at least one of the vacuum ultraviolet rays and the far ultraviolet rays during said oxidizing step so as to oxidize the article to be treated by interacting the at least one of the vacuum ultraviolet rays and the far ultraviolet rays therewith during oxidation of the article to be treated by said ozone and the activated oxygen.

6. Process for oxidation of an article to be treated according to claim 4, wherein the far ultraviolet ray source is selected from the group consisting of a mercury high pressure lamp, a mercury low pressure lamp, a krypton-fluorine excimer lamp, and krypton-fluorine excimer laser.

7. Process for oxidation of an article to be treated according to claim 1, wherein said irradiating step comprises the further step of also irradiating the oxygen-containing gas in the treatment chamber with far ultraviolet rays emitted from a far ultraviolet ray source, the ozone and the activated oxygen being produced during said producing step by photochemical reaction of the oxygen-containing gas with both the vacuum ultraviolet rays and the far ultraviolet rays.

8. Process for oxidation of an article to be treated according to claim 7, wherein the far ultraviolet ray source is selected from the group consisting of a mercury high pressure lamp, a mercury low pressure lamp, a krypton-fluorine excimer lamp, and krypton-fluorine excimer laser.

9. Process for oxidation of an article to be treated according to claim 7, wherein said oxidizing step further comprising the step of irradiating the article to be treated with at least one of the vacuum ultraviolet rays and the far ultraviolet rays during said oxidizing step so as to oxidize the article to be treated by interacting the at least one of the vacuum ultraviolet rays and the far ultraviolet rays therewith during oxidation of the article to be treated by said ozone and the activated oxygen.

10. Process for oxidation of an article to be treated according to claim 9, wherein the far ultraviolet ray source is selected from the group consisting of a mercury high pressure lamp, a mercury low pressure lamp, a krypton-fluorine excimer lamp, and krypton-fluorine excimer laser.

11. Process for oxidation of an article to be treated according to claim 9, wherein, during said oxidizing step a surface layer is removed as a gas from the article to be treated.

12. Process for oxidation of an article to be treated according to claim 7, wherein, during said oxidizing step a surface layer is removed as a gas from the article to be treated.

13. Process for oxidation of an article to be treated according to claim 1, wherein the dielectric barrier discharge lamp used in performing said irradiating step has one of a double cylindrical shape and a flat shape.

14. Process for oxidation of an article to be treated according to claim 13, wherein the dielectric barrier discharge lamp used in performing said irradiating step has an exit part through which the vacuum ultraviolet rays of the dielectric barrier discharge lamp are emitted, said exit part being formed of a material selected from the group consisting of synthetic quartz glass, sapphire, an alkali-metal halogenide, and a earth alkali metal halogenide.

15. Process for oxidation of an article to be treated, according to claim 7, wherein said oxidizing step further comprising the step of irradiating the article to be treated with both the vacuum ultraviolet rays and the far ultraviolet rays during said oxidizing step so as to oxidize the article to be treated by interacting the vacuum ultraviolet rays and the far ultraviolet rays therewith during oxidation of the article to be treated by said ozone and the activated oxygen; and wherein the oxidation of the article to be treated by the interacting thereof with the vacuum ultraviolet rays and the far ultraviolet rays is performed in accordance with the relationship:

$$(p \times d)/(1+I^{1/2}) = 0.33$$

where I is a radiation density (mW/cm$^2$) of the far ultraviolet rays on a surface of the article to be treated in which there is no light absorption between the far ultraviolet ray source and the surface of the article to be treated, d is a shortest distance (cm) of passage of the vacuum ultraviolet rays emitted from the dielectric barrier discharge lamp to the surface of the article to be treated, and p is an oxygen partial pressure (atm) of the oxygen-containing gas in the treatment chamber, which is present between the dielectric barrier discharge lamp and the article to be treated.

* * * * *